United States Patent
Rohner

[19]

[11] Patent Number: 6,097,361
[45] Date of Patent: Aug. 1, 2000

[54] PHOTOLITHOGRAPHIC EXPOSURE SYSTEM AND METHOD EMPLOYING A LIQUID CRYSTAL DISPLAY (LCD) PANEL AS A CONFIGURABLE MASK

[75] Inventor: Don R. Rohner, Austin, Tex.

[73] Assignee: Advanced Micro Devices, Inc., Sunnyvale, Calif.

[21] Appl. No.: 08/790,392

[22] Filed: Jan. 29, 1997

[51] Int. Cl.[7] .................................................. G09G 3/36
[52] U.S. Cl. ................................ 345/87; 345/102; 349/2
[58] Field of Search ................................ 345/87, 88, 89, 345/102, 98, 99, 100, 204, 205, 206, 207; 430/311; 349/2, 4, 25, 29, 30, 61, 62

[56] References Cited

U.S. PATENT DOCUMENTS

| | | | |
|---|---|---|---|
| 4,601,537 | 7/1986 | Saccocio | 345/207 |
| 4,751,509 | 6/1988 | Kubota et al. | 345/207 |
| 4,760,389 | 7/1988 | Aoki et al. | 345/207 |
| 5,053,679 | 10/1991 | Thioulouse | 345/207 |
| 5,109,290 | 4/1992 | Imai | 349/2 |
| 5,917,464 | 6/1999 | Stearns | 345/207 |

OTHER PUBLICATIONS

Wolf et al., *Silicon Processing for the VLSI Era vol. 1: Process Technology*, Lattice Press 1986, pp. 472–473.
O'Mara, *Liquid Crystal Flat Panel Displays*, Van Nostrand Reinhold 1993, pp. 33–34.

*Primary Examiner*—Xiao Wu
*Attorney, Agent, or Firm*—Kevin L. Daffer; Conley, Rose & Tayon

[57] ABSTRACT

A photolithographic exposure system and method are presented which employ an LCD panel as a configurable mask. The exposure system includes a light source and an LCD panel. The LCD panel displays a desired pattern, and is positioned between the light source and a light-sensitive layer. The LCD panel includes a plurality of pixel elements (i.e., pixels) arranged in a two-dimensional matrix. Each pixel either substantially passes or blocks light produced by the light source in response to one or more electrical display signals. In addition to the LCD panel, an LCD system includes a display driver, a control unit, and a memory unit. The display driver is coupled to the LCD panel and produces the electrical display signals. The memory unit stores LCD panel display data. The control unit is coupled between the display driver and the memory unit The control unit retrieves data from the memory unit and provides the data to the display driver. The control unit may be adapted for coupling to a computer system, and further configured to receive data from the computer system and to store the data within the memory unit. A step-and-repeat projection exposure system is described which employs the LCD panel as a configurable mask. An exposure method employing multiple overlapping exposures reduces the deleterious effects of an opaque structure formed around the pixels to prevent light from passing through the LCD panel between the pixels.

27 Claims, 13 Drawing Sheets

PHOTOLITHOGRAPHIC EXPOSURE SYSTEM AND METHOD EMPLOYING A LIQUID CRYSTAL DISPLAY (LCD) PANEL AS A CONFIGURABLE MASK

BACKGROUND OF THE INVENTION

1. Field of the Invention

This invention relates to the manufacture of electronic circuits and more particularly to the manufacture of integrated circuits and printed circuit boards by patterning layers in succession to form features which comprise elements of an integrated circuit or a printed circuit board.

2. Description of the Relevant Art

In the manufacture of electronic circuits, one or more features are often formed by removing unwanted portions of a layer of a desired material. For example, printed circuit boards, also called printed wiring boards, are typically manufactured by first depositing a layer of a metal (e.g., copper) upon an entire major surface of a flat sheet of an insulating material (e.g., epoxy-fiberglass composite). Unwanted portions of the metal layer are then removed in order to form the familiar conductive metal traces which provide point-to-point electrical connections. The process of removing unwanted portions of a layer of a desired material is called patterning. Integrated circuits are also manufactured by patterning layers of desired materials to form features upon substantially flat surfaces.

A layer of a desired material is typically patterned using a process called photolithography. Photolithography involves forming a protective layer of a light-sensitive material over the entire exposed surface of the layer to be patterned. The layer of the light-sensitive material is patterned by passing light through a mask in order to transfer a desired pattern to the light-sensitive material. Exposure to light either makes portions of the light-sensitive material soluble in a developing liquid (e.g., a positive photoresist material) or making the exposed portions insoluble in the developing liquid (e.g., a negative photoresist material). Following exposure, the layer of the light-sensitive material is developed in a manner analogous to the developing of exposed photographic film. The soluble portions of the layer of light-sensitive material directly overlying the unwanted portions of the underlying layer to be patterned are removed by immersion in the developing liquid, exposing the unwanted portions of the underlying layer. The exposed unwanted portions of the underlying layer are then removed during a subsequent etch step. Following the etch step, the remaining portions of the layer of light-sensitive material are removed, leaving one or more features formed from the layer of the desired material.

Due to the physical size of a typical printed circuit board (PCB), a process called proximity printing is commonly used to transfer a desired pattern to a layer of a light-sensitive material formed over a metal layer of the PCB. In proximity printing, the mask is the same size as the pattern being formed. The mask is placed between a light source and the PCB during exposure such that the mask is in close proximity to the light-sensitive layer.

The microscopic feature sizes of integrated circuits typically preclude proximity printing. Integrated circuit features are commonly formed using a process called projection printing. In projection printing, lens elements or mirrors are used to form an image of the mask such that the image is much smaller than the mask itself. The mask image is cast upon the surface of a layer of a lightsensitive material formed over a layer of a material to be patterned.

Semiconductor wafer fabrication involves forming multiple identical integrated circuits upon the surface of a single semiconductor wafer. The surface of the semiconductor wafer is divided into separate die areas, and an integrated circuit is formed within each die area. Common step-and-repeat projection exposure systems cast a mask image within each die area, one after another, until portions of a layer of a light-sensitive material covering all die areas have been exposed. A mask used in such a step-and-repeat projection exposure system is often called a "reticle". As used herein, the term "mask" will be used to describe a tool containing one or more patterns and used to selectively expose portions of a layer of a light-sensitive material to light. It is noted that this definition encompasses the term "reticle".

A mask used in photolithography is typically a glass plate having clear and opaque regions. The clear regions allow light incident upon one side of the mask to pass through the mask. The opaque regions block incident light, preventing light from passing through the mask. The opaque regions are typically made up of features formed from a layer of an opaque material such as emulsion, chrome, or iron oxide.

Masks are made by a detailed pattern transfer process. First, a layer of a desired opaque material is formed over a major surface of a glass plate. A layer of a light-sensitive or charge-sensitive material is then formed over the entire exposed surface of the opaque layer. In the case of a layer of a light-sensitive material, the layer is exposed by repeatedly projecting relatively small polygons (e.g., rectangles) of light upon the surface of the light-sensitive layer, overlapping the projections in order to transfer a desired pattern to the light-sensitive layer. A layer of a charge-sensitive material is exposed by scanning the entire surface of the charge-sensitive layer with an electron gun capable of producing a relatively narrow beam of electrons. Selected regions of the charge-sensitive material are exposed to a beam of electrons during scanning in order to transfer a desired pattern to the charge-sensitive layer. Following exposure, the layer of the light-sensitive or charge-sensitive material is developed, exposing the unwanted portions of the underlying layer of the opaque material. The unwanted portions of the underlying layer of the opaque material are then removed by etching. Following the etch step, the remaining portions of the layer of light-sensitive or charge-sensitive material are removed, leaving opaque features formed from the layer of the opaque material.

The pattern transfer process used to define the clear and opaque regions of a mask requires accuracy, precision, and time. As a result, masks are expensive and require a certain amount of time to produce. In addition, masks reflect a selected circuit layout, and generally cannot be modified. Fabrication of a modern integrated circuit typically requires 10 or more combined layering and patterning (i.e., masking) steps, each requiring a unique mask. A change to a design of an integrated circuit may require the fabrication of several new masks in order to implement the design change. In addition, masks do not promote integrated circuit layout experimentation in order to evaluate alternate circuit layouts in terms of circuit performance.

Liquid crystal displays (LCDs) are commonly used in calculators, watches, hand-held games, portable television sets, portable computer monitors, and projection display systems. A typical LCD includes a liquid crystal material sandwiched between two glass plates. Multiple light control elements of an LCD selectively pass or block light in response to an electrical signal (i.e., an applied electric field). Calculators and watches include a linear array of numerical LCDs. Each numerical LCD is capable of displaying a decimal character between '0' and '9'. Each numerical LCD includes seven light control elements called "segments". A decimal character is displayed when two or more segments of a numerical LCD are active; only two active segments are required to display the number '1', while all seven segments must be active to display the number '8'.

LCDs used in portable televisions, portable computer monitors, hand-held games, and projection display systems are graphical LCDs. A graphical LCD includes a large number of identical light control elements called "pixels" arranged in a two-dimensional array. A graphical LCD displays characters (e.g., numbers and letters) and graphical representations by activating several pixels simultaneously.

LCD projection display systems include LCD panels having pixels which selectively block light or allow light to pass through the panel. In a black-and-white LCD panel, a pixel receiving an electrical signal (i.e., an active pixel) typically blocks light. Adjacent inactive pixels form "clear" (i.e., transparent) regions which allow light to pass through the LCD panel. Substantially opaque regions are formed where several adjacent pixels of the LCD panel are active. It would be advantageous that a pattern be displayed upon an LCD panel which would desirably allow the LCD panel to function as a mask. Unlike a mask, however, the pattern formed on an LCD panel may be changed in a fraction of a second simply by altering the electrical display signals. Currently, 10 in.×10 in. LCD panels are available which have over 1,000,000 pixels arranged in two-dimensional arrays of 1,000+ pixels by 1,000+ pixels.

It would thus be desirable to use an LCD panel as a configurable mask for photolithography. Such a mask may be quickly and easily modified, allowing design changes to be implemented in a fraction of the time currently required to fabricate one or more conventional masks. In addition, the expense involved in effecting such a design change is minimal. Furthermore, such an easily modifiable mask would promote circuit layout experimentation in search of improved circuit performance.

SUMMARY OF THE INVENTION

The problems outlined above are in large part solved by a photolithographic system and method employing an LCD panel as a configurable mask. The exposure system may be used to selectively expose a portion of a layer of a light-sensitive material to light. The exposure system includes a light source and an LCD panel. The LCD panel is configured to display a desired pattern, and is positioned between the light source and the light-sensitive layer. The LCD panel includes a plurality of pixel elements (i.e., pixels) arranged in a two-dimensional matrix. Each of the pixels either substantially passes light produced by the light source or substantially blocks light produced by the light source in response to one or more electrical signals applied to the LCD pixel array. Adjacent pixels which substantially pass light produced by the light source make up clear regions of the displayed pattern, and adjacent pixels which substantially block light produced by the light source make up opaque regions of the displayed pattern.

The LCD panel is part of an LCD system which functions as a mask during a selective exposure process. In addition to the LCD panel, the LCD system includes a display driver, a control unit, and a memory unit. The display driver is coupled to the LCD panel and produces the electrical signals which control the pixels of the LCD panel. The memory unit is configured to store LCD panel display data. The memory unit may include, for example, volatile or non-volatile semiconductor memory devices. The control unit is coupled between the display driver and the memory unit, and is configured to retrieve data from the memory unit and to provide the data to the display driver. The control unit may be adapted for coupling to a computer system, and further configured to receive data from the computer system and to store the data within the memory unit.

A step-and-repeat projection exposure system is described which may be used to selectively expose a portion of a layer of a light-sensitive material formed upon a surface of a semiconductor wafer. As described above, the surface of a semiconductor wafer is typically divided into multiple separate die areas, and an integrated circuit is formed within each die area. The step-and-repeat projection exposure system may be used to cast a mask image within each die area, one after another, until portions of the light-sensitive layer directly overlying all die areas have been exposed. The step-and-repeat projection exposure system includes a light source, an LCD panel, a mirror, a filter, a condenser lens, a fan, a reduction lens, an x-y stage, and a base. The light source produces light at a plurality of wavelengths. The LCD panel is positioned between the light source and the light-sensitive layer, and is configured to display a desired pattern. The LCD panel is part of an LCD system as described above. The mirror is positioned on the side of the light source opposite that of the LCD panel, and reflects stray light back to the light source. The filter is positioned between the light source and the LCD panel, and is configured to pass light produced by the light source having wavelengths within a desired range. The condenser lens is positioned between the filter and the LCD panel, and is configured to focus light which passes through the filter. The reduction lens is positioned between the LCD panel and the light-sensitive layer, and is configured to focus light which passes through the LCD panel in order to form an image of the pattern displayed by the LCD panel upon the layer of the light-sensitive material. The fan is configured to blow air across the filter and the LCD panel in order to cool the filter and LCD panel during use. The semiconductor wafer is positioned upon the x-y stage. The x-y stage is configured to move the semiconductor wafer laterally in relation to the light focused by the reduction lens in order to expose portions of the layer of the light-sensitive material directly overlying each die area of the semiconductor wafer. The x-y stage is positioned upon the base. The mirror, the light source, the filter, the condenser lens, the LCD panel, the fan, and the reduction lens are held in a fixed position relative to the base.

As any exposure of a portion of a light-sensitive material to light cannot be reversed, an opaque structure must be formed in the substantially transparent areas between the pixels of the LCD panel in order to prevent light from passing through the LCD panel between the pixels. The exposure problem presented by the opaque structure may be reduced by using an exposure method employing multiple overlapping exposures. The method involves positioning the LCD panel between the light source and the light-sensitive layer and generating the one or more electrical signals needed to display a first pattern upon the LCD panel. The light-sensitive layer is then exposed to light passing through the LCD panel for a predetermined exposure period. The one or more electrical signals are then altered in order to cause each pixel of the LCD panel to substantially block light produced by the light source. While the light is blocked, the light-sensitive layer is repositioned a fraction of a dimension of a pixel in a predetermined direction. The one or more electrical signals are then altered in order to display a second pattern upon the LCD panel. The second pattern is designed to reinforce the first pattern and to expose portions left unexposed during the first exposure due to the presence of the opaque lines between pixels. The light-sensitive layer is again exposed to light passing through the LCD panel for the predetermined exposure period.

BRIEF DESCRIPTION OF THE DRAWINGS

Other objects and advantages of the invention will become apparent upon reading the following detailed description and upon reference to the accompanying drawings in which.

Figure 1:
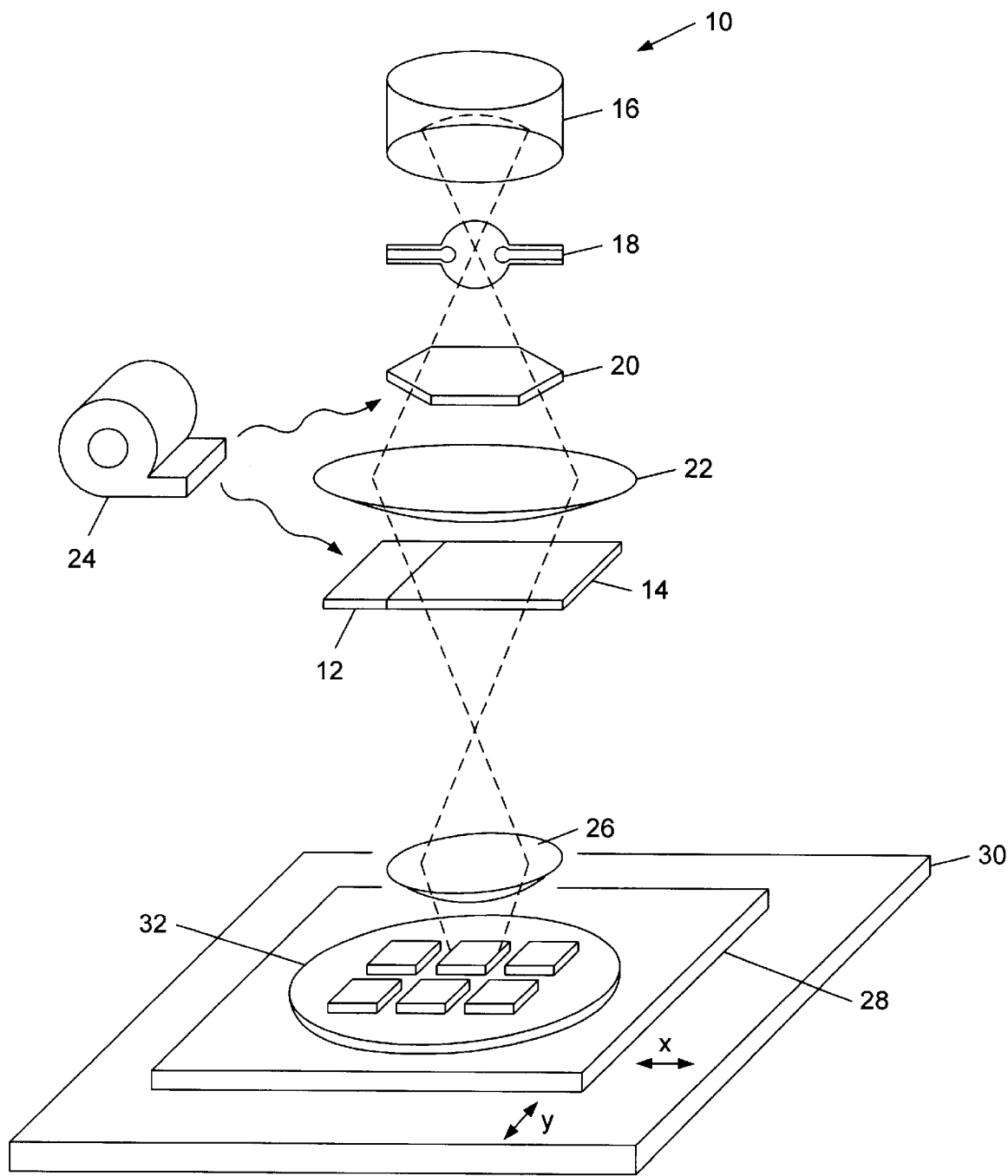
FIG. 1 is a perspective view of a step-and-repeat projection exposure system including an LCD system having an LCD panel which functions as a configurable mask.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a perspective view of a step-and-repeat projection exposure system 10 including an LCD system 12 having an LCD panel 14 which functions as a configurable mask. Step-and-repeat projection system 10 also includes a mirror 16, a light source 18, a filter 20, a condenser lens 22, a fan 24, a reduction lens 26, an x-y stage 28, and a base 30. Step-and-repeat projection system 10 is shown projecting a pattern image upon (i.e., exposing) a portion of a layer of a light-sensitive material directly overlying a die area of a semiconductor wafer 32. The pattern image is produced by passing light produced by light source 18 through a pattern displayed upon LCD panel 14.

Light source 18 of step-and-repeat projection system 10 produces light having one or more wavelengths. When light source 18 produces light at multiple wavelengths, filter 20 is used to select light produced by light source 18 and having wavelengths within a desired range. Filter 20 is positioned between light source 18 and condenser lens 22. Light at wavelengths within the desired range passes through filter 20 to condenser lens 22. Light at wavelengths not within the desired range are absorbed by filter 20 and do not pass through filter 20. Mirror 16 is positioned on the side of light source 18 opposite that of filter 20, and is used to recapture light not directed toward filter 20 (i.e., stray light) produced by light source 18 by reflecting the stray light back to light source 18. Condenser lens 22 condenses (i.e., focuses) incident light produced by light source 18. LCD panel 14 is located in the path of the focused light produced by condenser lens 22. LCD panel 14 is configured to selectively block portions of the light produced by condenser lens 22, thus producing a pattern image. Reduction lens 26 focuses the image upon the single die area of semiconductor wafer 32. In doing so, reduction lens 32 decreases the proportions of (i.e., reduces) -the pattern image cast by LCD panel 14.

Semiconductor wafer 32 is positioned upon x-y stage 28. X-y stage 28 is positioned upon base 30. During use, mirror 16, light source 18, filter 20, condenser lens 22, LCD system 12, fan 24, and reduction lens 26 are held in a fixed position relative to base 30. X-y stage 28 includes a positioning mechanism (not shown) which moves x-y stage 32 laterally in any direction relative to the light focused by reduction lens 32. Lateral movement of x-y stage 28 allows step-and-repeat projection system 10 to expose portions of the layer of the light-sensitive material directly overlying each die area of semiconductor wafer 32. Fan 24 blows air across filter 20 and LCD system 12 during use in order to cool filter 20 and LCD system 12.

Light source 18 preferably produces light in the ultraviolet wavelength range extending from about 350 nanometers (nm) to about 450 nm. Light source 18 may be, for example, a mercury-vapor (i.e., mercury-arc) lamp. Such a lamp produces light with wavelengths extending from about 200 nm to over 600 nm, with strong emissions in the ultra-violet range centered around 365 nm, 405 nm, and 436 nm.

It is noted that step-and-repeat projection system 10 may be used to expose portions of the layer of the light-sensitive material directly overlying two or more die areas of semiconductor wafer 32 at the same time. In this case, LCD panel 14 of LCD system 12 is configured to produce multiple pattern images.

Figure 2:
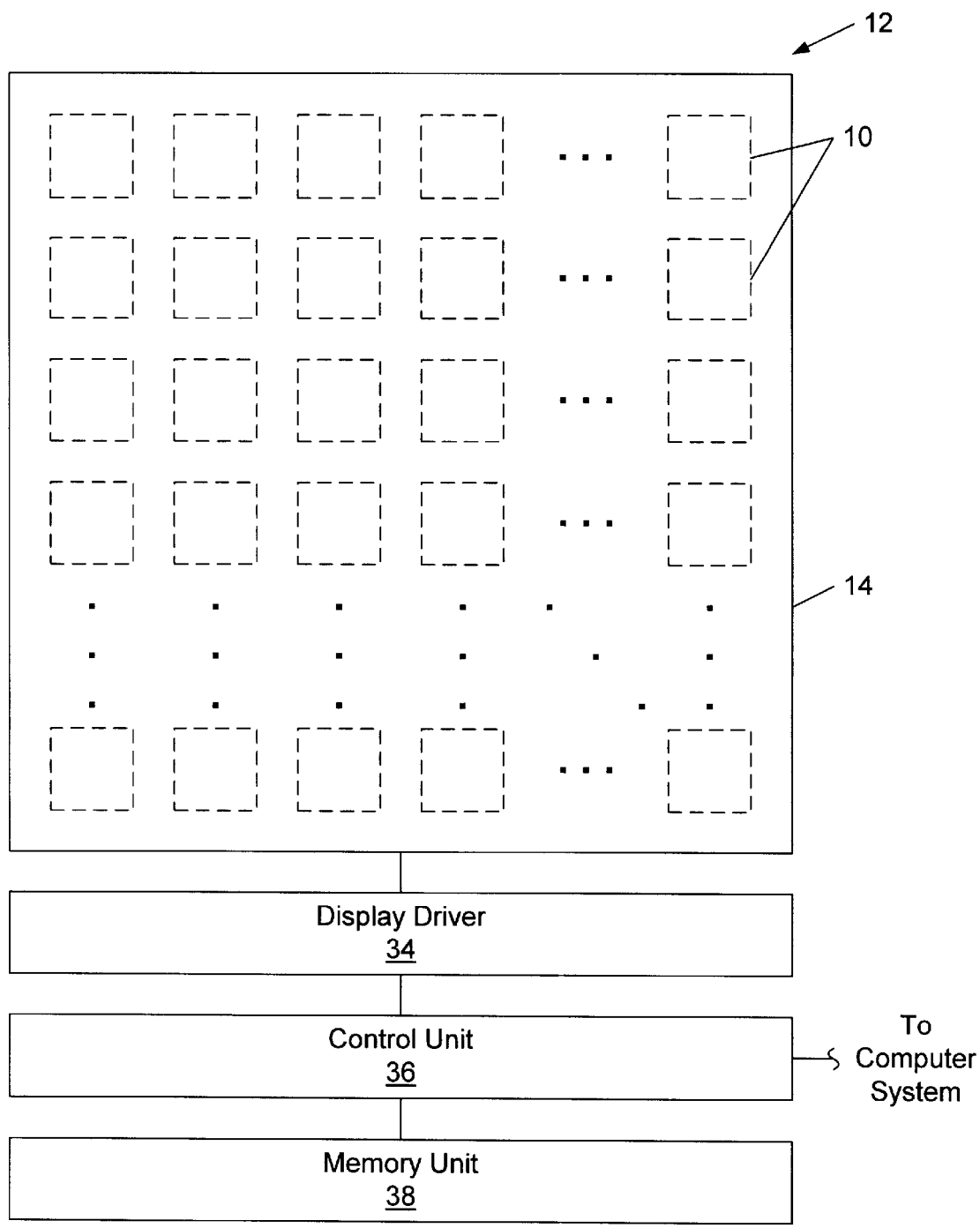
FIG. 2 is a block diagram of a preferred embodiment of the LCD system of FIG. 1, wherein the LCD panel of the LCD system includes multiple pixels.

FIG. 2 is a block diagram of a preferred embodiment of LCD system 12. In addition to LCD panel 14, LCD system 12 includes a display driver 34 coupled to LCD panel 14, a control unit 36 coupled to display driver 34, and a memory unit 38 coupled to control unit 36. Memory unit 38 stores data necessary to display a desired pattern upon LCD panel 14. Control unit 36 is configured to retrieve display data from memory unit 38 and to forward the display data to display driver 34. Display driver 34 receives the display data and produces multiple electrical display signals required to display the desired pattern upon LCD panel 14. LCD panel 14 receives the display signals and displays the desired pattern in response to the display signals. Control unit 36 is also adapted for coupling to an external computer system in order to receive display data from the computer system, and is configured to store the display data within memory unit 38.

LCD panel 14 includes multiple pixel elements (i.e., pixels) 40 arranged in a two-dimensional array. As will be described in detail below, each pixel is activated by creating an electric field within the pixel. Inactive pixels allow light incident upon one side of LCD panel 14 to pass through LCD panel 14. Active pixels block light, preventing the incident light from passing through LCD panel 14. Adjacent inactive pixels form clear regions, and adjacent active pixels form opaque regions. A pattern may be formed by selective activation of pixels 40, allowing LCD panel 14 to functions as a configurable mask during a photolithographic process. The display signals produced by display driver 34 activate certain pixels of LCD panel 14 in order to display a desired pattern.

Memory unit 38 may include one or more volatile semiconductor memory devices such as well known static or dynamic random access memory (RAM) devices. Alternately, memory unit 38 may include one or more non-volatile semiconductor memory devices. Suitable non-volatile semiconductor memory devices include well known electrically erasable programmable read only memory (EEPROM) devices, flash memory devices, and non-volatile random access memory (NV-RAM) devices. Flash memory devices are sometimes called flash EEPROM devices, and differ from EEPROM devices in that electrical erasure involves large sections of, or the entire contents of, a flash memory device. NV-RAM devices are sometimes referred to as battery-backed RAM devices, and comprise volatile RAM cells and a battery which provides backup power to the RAM cells in the event of an interruption of a supply of electrical power to memory unit 38.

Figure 3:
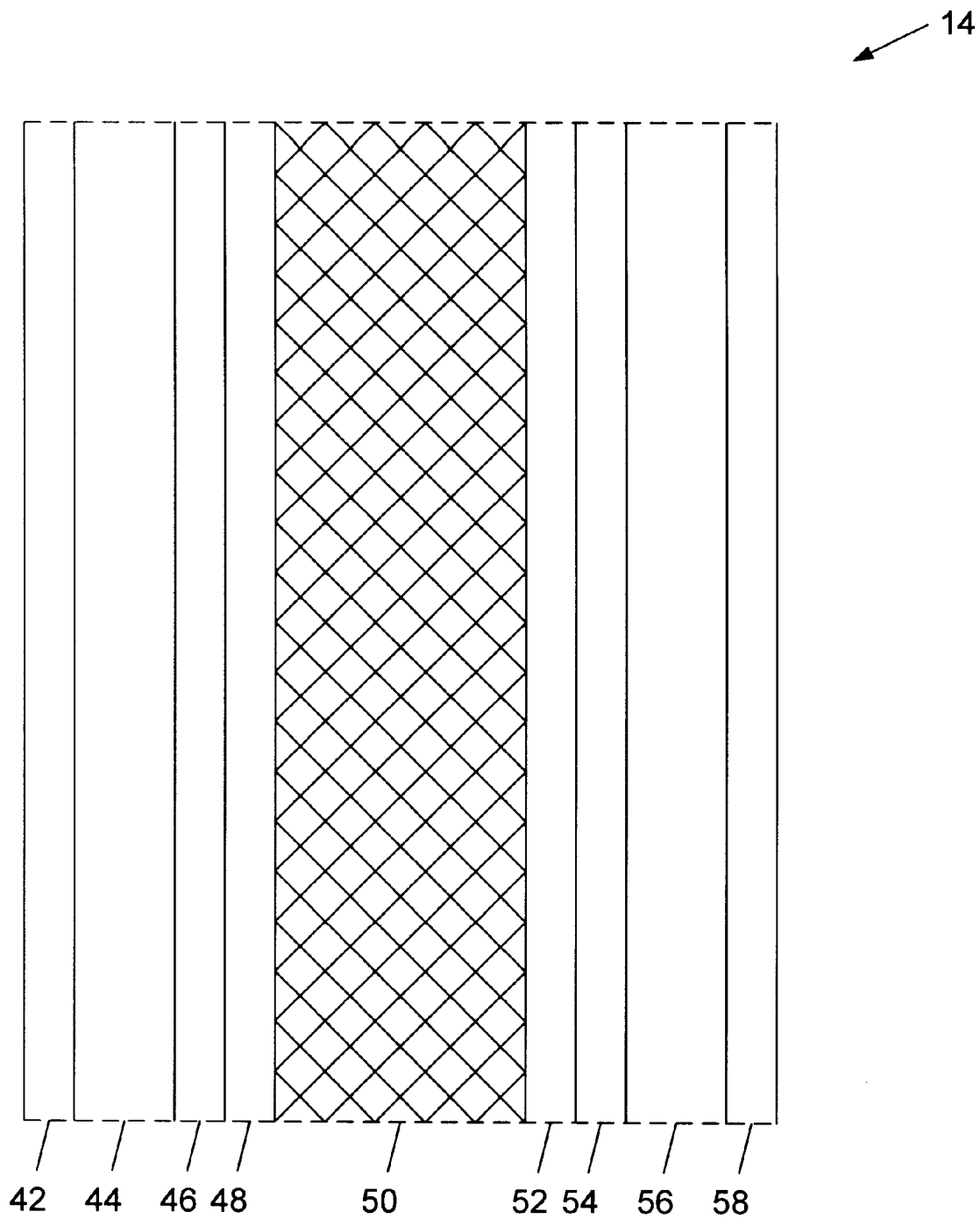
FIG. 3 is a cross-sectional view of a pixel region of the LCD panel of FIG. 2.

FIG. 3 is a cross-sectional view of a pixel region of LCD panel 14. The pixel region of LCD panel 14 includes a first polarizing layer 42, a first glass plate 44, a first transparent electrode 46, a first orientation layer 48, a liquid crystal material 50, a second orientation layer 52, a second transparent electrode 54, a second glass plate 56, and a second polarizing layer 58. First polarizing layer 42 and second polarizing layer 58 pass incident light traveling in a single plane and absorb all incident light not traveling in the plane. The planes defined by first polarizing layer 42 and second polarizing layer 58 are typically perpendicular. First glass plate 44 and second glass plate 56 form the rigid structure of LCD panel 14. Major flat surfaces of first glass plate 44 and second glass plate 56 are parallel to one another and spaced a certain distance apart in order to allow LCD panel 14 to operate within a selected light wavelength range. First transparent electrode 46 and second transparent electrode 54 are transparent electrical conductors. An electric field formed between first transparent electrode 46 and second transparent electrode 54 activates the pixel existing between the two electrodes. Molecules of liquid crystal material 50 are rod like, have a long axis, and display a specific alignment which is changed in the presence of an electric field. First orientation layer 48 serves to orient molecules of liquid crystal material 50 directly overlying first orientation layer 48 such that the long axes of the molecules are parallel to the orientation of first polarizing layer 42. Similarly, second orientation layer 52 serves to orient molecules of liquid crystal material 50 directly overlying second orientation layer 52 such that the long axes of the molecules are parallel to the orientation of second polarizing layer 58.

Figure 4A:
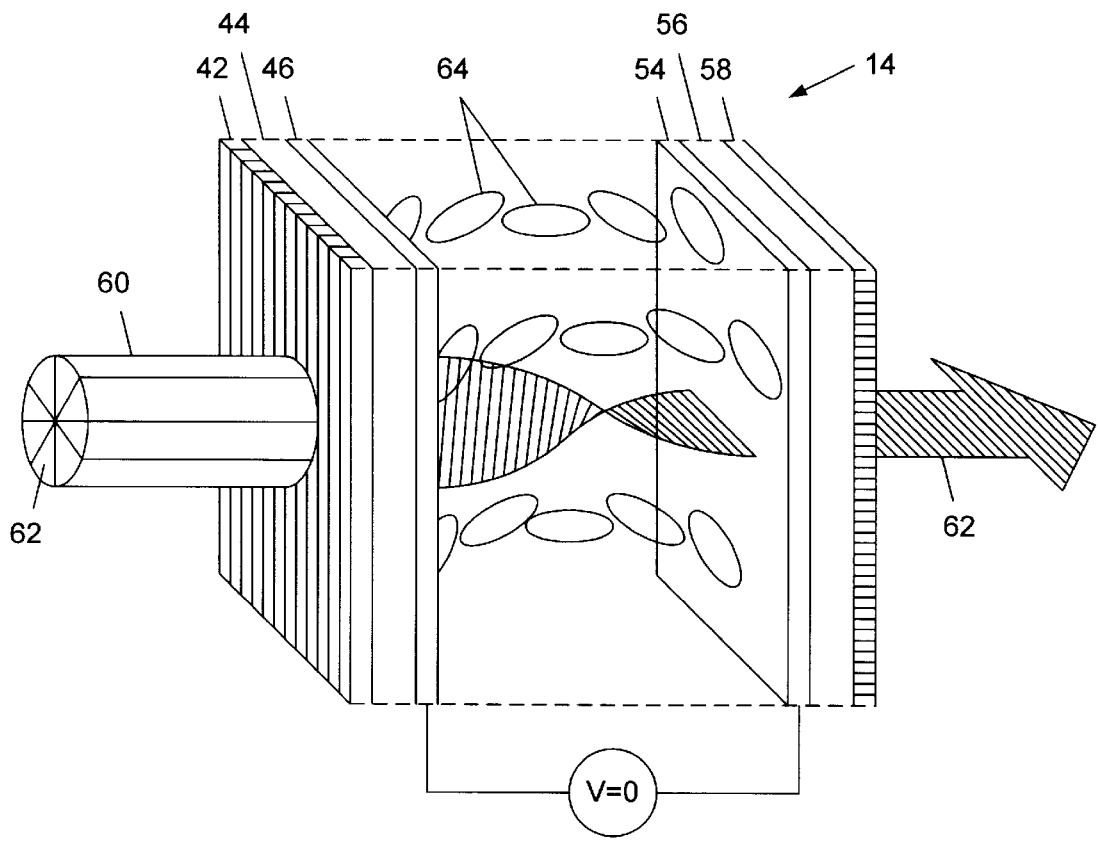
FIG. 4a is a perspective view of a pixel element of the LCD panel during operation when no electric field exists between two transparent electrodes, wherein the planarization of a planar component of a light beam rotates with orientations of layers of molecules of a liquid crystal material as the planar component passes through the liquid crystal material, and as a result the planar component is able to pass through the LCD panel.
Figure 4B:
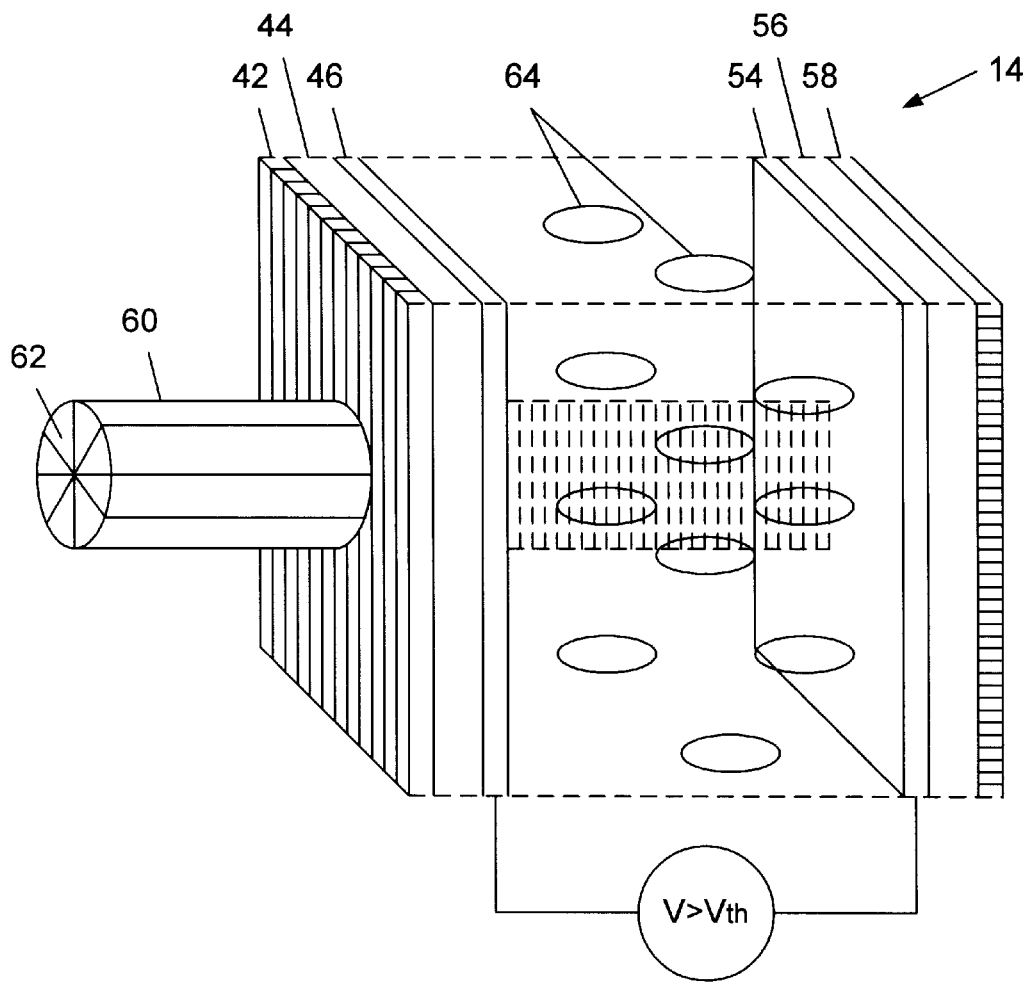
FIG. 4b is a perspective view of the pixel element of FIG. 4a when an electric field exists between two transparent electrodes, wherein the molecules of the liquid crystal material do not change the planarization of the planar component as the planar component passes through the liquid crystal material, and as a result the planar component is not able to pass through the LCD panel.

FIGS. 4a–b will be used to describe the operation of pixels 40 of LCD panel 14. In FIGS. 4a–b, the orientation of second polarizing layer 58 is perpendicular to (i.e., 90 degrees with respect to) the orientation of first polarizing layer 42. A beam of light 60 incident upon first polarizing layer 42 of LCD array 14 has components traveling in many different planes (i.e., having several different planar orientations). First polarizing layer 42 absorbs all components of light beam 60 except a planar component 62 parallel to the orientation of first polarizing layer 42. Planar component 62 passes through first polarizing layer 42, first glass plate 44, transparent electrode 46, and first orientation layer 48 (not shown).

In FIG. 4a, the magnitude of a voltage V applied between first transparent electrode 46 and second transparent electrode 54 is 0. As a result, no electric field exists between the transparent electrodes. In the absence of such an electric field, molecules 64 of liquid crystal material 50 orient themselves with their long axes parallel to the glass plates, forming layers of molecules in planes between and parallel to the glass plates. The long axes of molecules within a given layer are substantially parallel, defining an orientation for the layer. A small angle exists between the orientation of one layer and the orientation of adjacent layers. The result is a rotational or twisting effect in the orientations of layers as viewed when moving from one transparent electrode to the other through liquid crystal material 50.

As component 62 of light beam 60 travels through liquid crystal material 50, the plane in which component 62 exists (i.e., the planarization of component 62) rotates with the orientations of the layers of the molecules of liquid crystal material 50. In FIG. 4a, the planarization of component 62 rotates 90 degrees as it passes through liquid crystal material 50. Component 62 then proceeds through second orientation layer 52 (not shown), second transparent electrode 54, and second glass plate 56. When component 62 arrives at second polarizing layer 58, the planarization of component 62 is parallel to the orientation of second polarizing layer 58, due to the 90 degree rotation of the planarization of component 62 by liquid crystal material 50, and component 62 is able to pass through second polarizing layer 58. Thus when an electric field does not exist between the two transparent electrodes of the pixel (i.e., when the pixel is not active), a planar component of light incident on one side of the pixel is able to pass through the pixel.

In FIG. 4b, the magnitude of voltage V between first transparent electrode 46 and second transparent electrode 54 is made greater than a threshold voltage $V_{th}$. As a result, an electric field is created between the transparent electrodes and having a strength sufficient to cause molecules 64 of liquid crystal material 50 to rotate 90 degrees, orienting themselves with their long axes perpendicular to the planar surfaces of the transparent electrodes. As before, planar component 62 of light beam 60 passes through first polarizing layer 42, first glass plate 44, transparent electrode 46, and first orientation layer 48 (not shown). In this case, the molecules of liquid crystal material 50 do not affect the planarization of component 62 as component 62 travels through liquid crystal material 50. Component 62 continues through second orientation layer 52 (not shown), second transparent electrode 54, and second glass plate 56. When component 62 arrives at second polarizing layer 58, the planarization of component 62 is perpendicular to the orientation of second polarizing layer 58. Component 62 is absorbed by second polarizing layer 58 and does not pass through second polarizing layer 58. Thus when an electric field is applied between the two transparent electrodes of the pixel (i.e., when the pixel is active), light incident on one side of the pixel is not able to pass through the pixel.

The glass plates used to form LCD panel 14 must be substantially flat, free of defects, and have high optical transmission at the selected exposure wavelengths. Glass plates used in 10 in.×10 in. LCDs are typically 1.1 mm thick. Polarizing layers used in LCDs are typically films made of a polarizer material sandwiched between protective acrylic layers. The polarizing films are bonded to the glass plates using transparent acrylic adhesives. LCD transparent electrodes are typically formed by depositing a relatively thin layer of indium tin oxide (ITO) upon the glass plates. ITO is a mixture of indium oxide and tin oxide. ITO is electrically conductive, and is also substantially transparent when deposited in thicknesses from about 1,000 to approximately 2,000 angstroms. LCD orientation layers are typically formed by depositing layers of a polyimide or other "hard" polymer material over the transparent electrodes. The exposed surfaces of the polymer layers are then prepared by rubbing with a fabric in a desired direction, leaving barely detectable grooves in the surfaces of the polymer layers. The liquid crystal material used in an LCD is typically a mixture of several compounds which optimize certain physical properties of the liquid crystal material. More information about the manufacture of LCDs may be obtained from *Liquid Crystal Flat Panel Displays* by William C. O'Mara, 1993, Van Nostrand Reinhold, New York, N.Y.

Figure 5A:
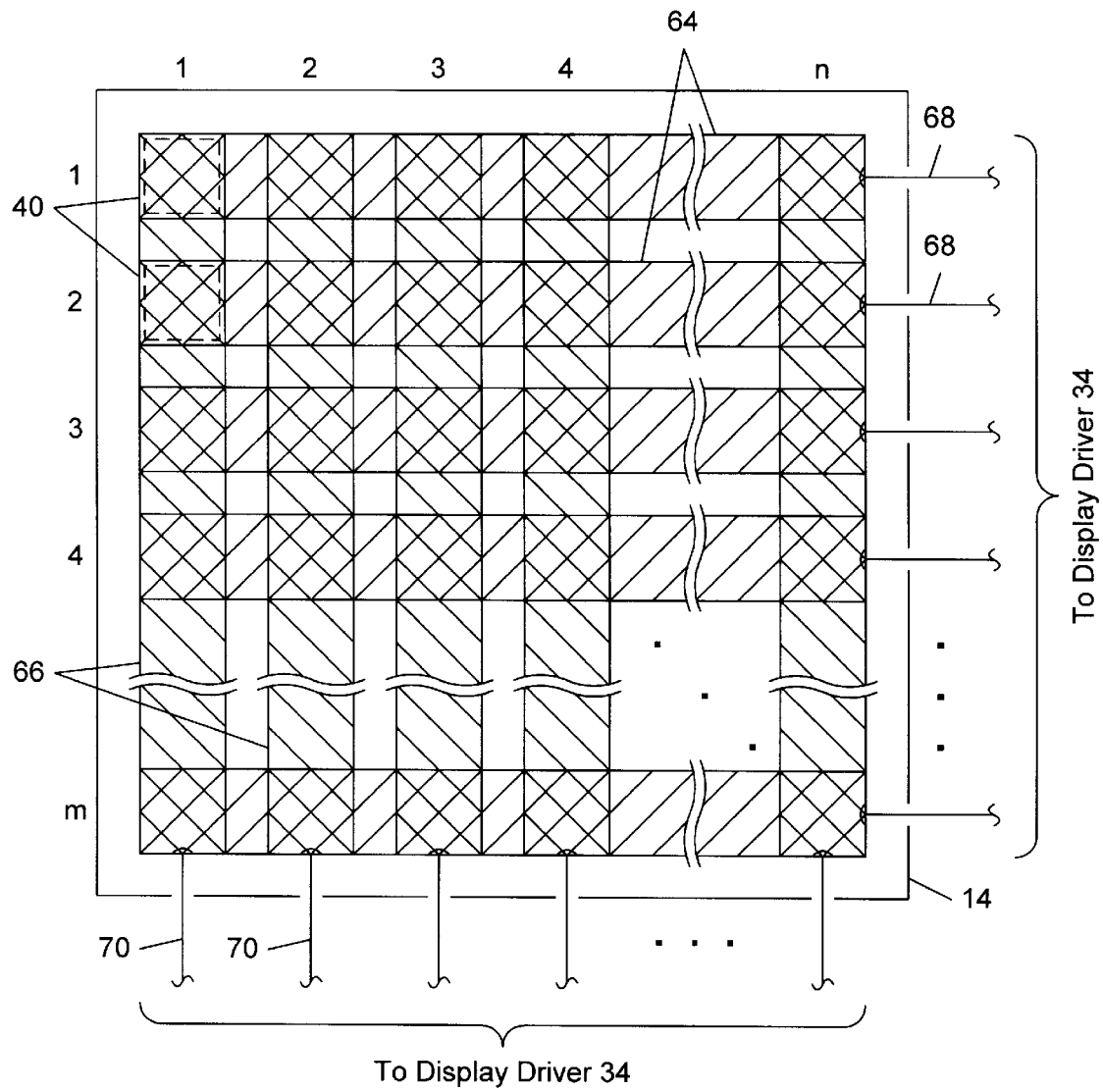
FIG. 5a is a top plan view of a "passive matrix" embodiment of the LCD panel including a set of transparent row electrodes and a set of transparent column electrodes, and wherein pixels exist where the row electrodes and the column electrodes cross.

FIG. 5a is a top plan view of a "passive matrix" embodiment of LCD panel 14 including a set of transparent row electrodes 64 and a set of transparent column electrodes 66. Row electrodes 64 are attached to an inner surface one of the two glass plates of LCD panel 14, and column electrodes 66 are attached to an inner surface of the other glass plate. Row electrodes 64 are connected to display driver 34 via corresponding row signal lines 68, and column electrodes 66 are connected to display driver 34 via corresponding column signal lines 70. Pixels 40 exist where row electrodes 64 and column electrodes 66 cross as shown in FIG. 5a. LCD panel 14 includes m row electrodes and n column electrodes, and is thus includes m·n pixels arranged in a two-dimensional m×n matrix. A pixel of LCD panel 14 is activated by applying a sufficient voltage between a row electrode and a column electrode which cross at the pixel location.

In the embodiment of FIG. 5a, pixels within the same row share have a common row electrode, and pixels within the same column share have a common column electrode. Thus the row and column electrodes are "multiplexed". A pattern may be displayed by selectively applying a voltage positive with respect to a ground potential (i.e., a positive voltage) to row electrodes and a voltage negative with respect to the ground potential (i.e., a negative voltage) to column electrodes. For example, the positive row voltage may be applied to the row electrodes in sequence. Row lines not receiving the positive row voltage are maintained at the ground potential. As the positive row voltage is applied to each row, the negative column voltage is applied to each column corresponding to a pixel within the row and to be activated. Column lines not receiving the negative column voltage are maintained at the ground potential. Operation of the embodiment of FIG. 5a relies upon the fact that a finite amount of time is required for the molecules of the liquid crystal material to change their orientations. As a result of the liquid crystal material response time, activated pixels continue to block light for a time period after an electric field formed between the electrodes collapses. The desired pattern is displayed as long as the amount of time between successive "address" cycles is substantially less than the response time of the liquid crystal material.

Figure 5B:
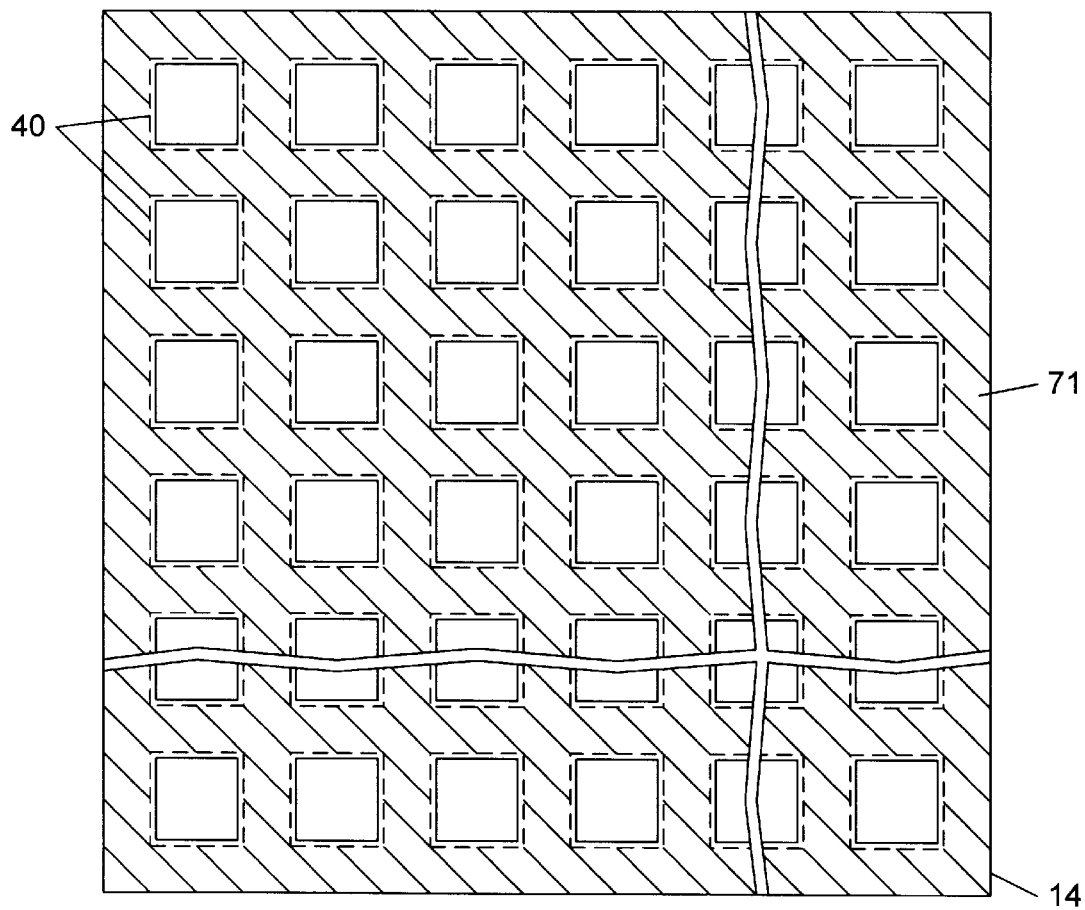
FIG. 5b is a top plan view of the passive matrix embodiment of the LCD panel of FIG. 5a illustrating an opaque structure located between the pixels within the LCD panel, wherein the opaque structure prevents light from passing through the LCD panel between the pixels.

As any exposure of a portion of a light-sensitive material to light cannot be reversed, the substantially "clear" (i.e., transparent) areas between pixels 40 must be made opaque. FIG. 5b is a top plan view of the passive matrix embodiment of LCD panel 14 illustrating an opaque structure 71 used to prevent light from passing through LCD panel 14 between pixels 40.

Figure 6A:
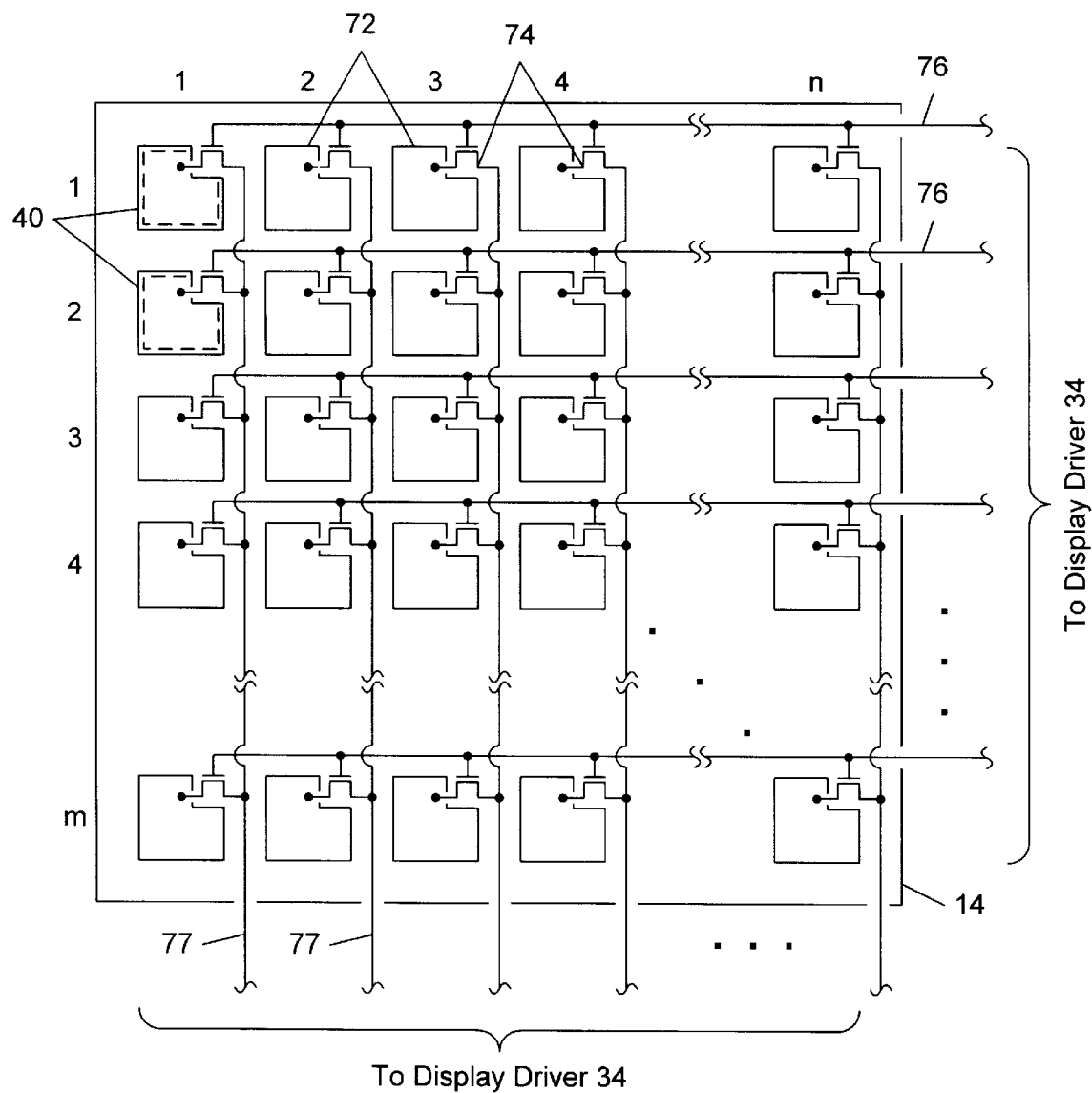
FIG. 6a is a top plan view of an "active matrix" embodiment of the LCD panel including multiple transparent pixel electrodes, corresponding electrical switching elements, and two sets of electrical signal lines.

FIG. 6a is a top plan view of an "active matrix" embodiment of LCD panel 14 including a two-dimensional m×n matrix of transparent pixel electrodes 72 and corresponding electrical switching elements 74. The electrical switching elements may be, for example, n-channel metal oxide semiconductor (MOS) transistors. Each MOS transistor has a source terminal, a drain terminal, and a gate terminal. When a voltage applied to the gate terminal is positive with respect to a voltage present at the source terminal, a low-resistance current path is formed between the drain and source terminals. The source terminal of each MOS transistor is connected to a corresponding pixel electrode 72. The gate terminals of all pixel electrodes in a given row are connected to a corresponding gate line 76, and the drain terminals of all pixel electrodes in a given column are connected to a corresponding drain line 77. Gate lines 76 and drain lines 77 are connected to display driver 34. In order to reduce their cross-sectional areas, gate lines 76 and drain lines 77 are typically made of metal (e.g., aluminum). As a result, gate lines 76 and drain lines 77 are usually opaque. All of the transparent pixel electrodes 72 are formed on an inner surface of one of the two glass plates. A continuous transparent ground electrode (not shown) is formed on an inner surface of the other glass plate, and is connected to a ground potential. Pixels 40 are defined by pixel electrodes 72.

In the embodiment of FIG. 6a, a pattern is displayed by selectively storing electrical charges on capacitances formed between the pixel electrodes and the ground electrode. For example, a positive gate voltage may be applied to gate lines 76 in sequence. Gate lines not receiving the positive gate voltage are maintained at the ground potential. As the positive gate voltage is applied to each gate line, a positive drain voltage is applied to each drain line corresponding to pixels within the row associated with the gate line and to be activated. The capacitances of the active pixels are charged to a positive voltage as current flows through the low-resistance paths formed between the drain terminals and the source terminals of the corresponding MOS transistors. The active pixels turn opaque as the molecules of the liquid crystal material between the electrodes change their orientations.

When the voltage applied to the gate line is returned to the ground potential, the resistances of the current paths between the drain and source terminals of the MOS transistors increase to a high value (i.e., the MOS transistors "turn off"). The positive voltages between the pixel electrodes and the ground electrode are maintained between successive address cycles by the charges stored on the capacitances.

Figure 6B:
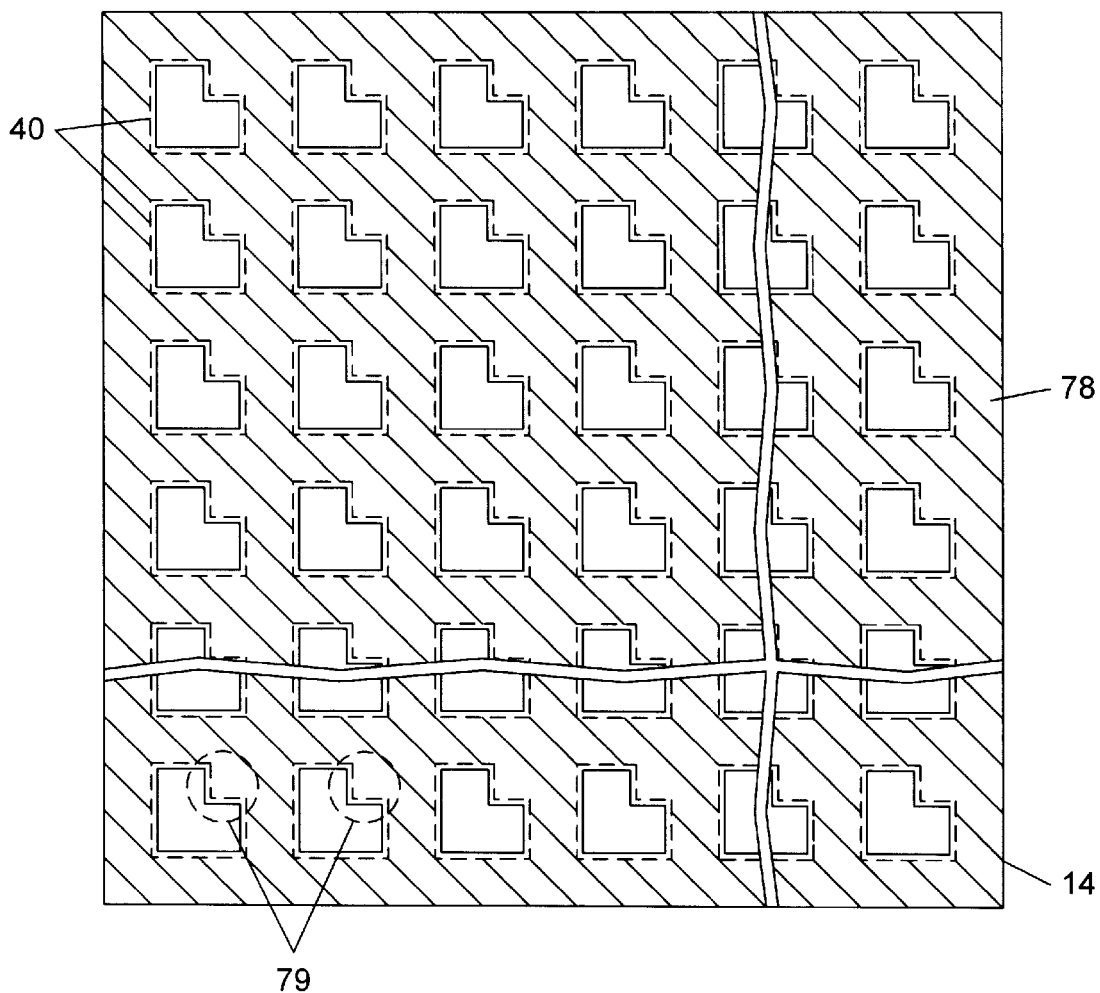
FIG. 6b is a top plan view of the active matrix embodiment of the LCD panel of FIG. 6a illustrating an opaque structure located between the pixels within the LCD panel, wherein the opaque structure prevents light from passing through LCD panel between the pixels, and wherein the opaque structure includes portions which shield the electrical switching elements from light.

As described above, any exposure of a portion of a light-sensitive material to light cannot be reversed. Accordingly, the substantially transparent areas between pixels 40 must be made opaque. FIG. 6b is a top plan view of the active matrix embodiment of LCD panel 14 illustrating an opaque structure 78 used to prevent light from passing through the active matrix embodiment of LCD panel 14 between pixels 40. In addition, the electrical switching elements in the embodiment of FIG. 6a are typically sensitive to light and must be shielded from light. Opaque portions 79 of opaque structure 78 are required to shield the electrical switching elements from light.

The contrast ratio of an LCD is defined as the ratio of the optical transmission of a "clear" pixel which passes light to the optical transmission of an opaque pixel which blocks light. A certain minimum contrast ratio is required for successful use of LCD panel 14 as a mask in a photolithographic process. It is noted that the embodiment of LCD panel 14 shown in FIGS. 6a–b is capable of a higher contrast ratio than the embodiment of FIGS. 5a–b due to charge storage between successive address cycles.

Figure 7:
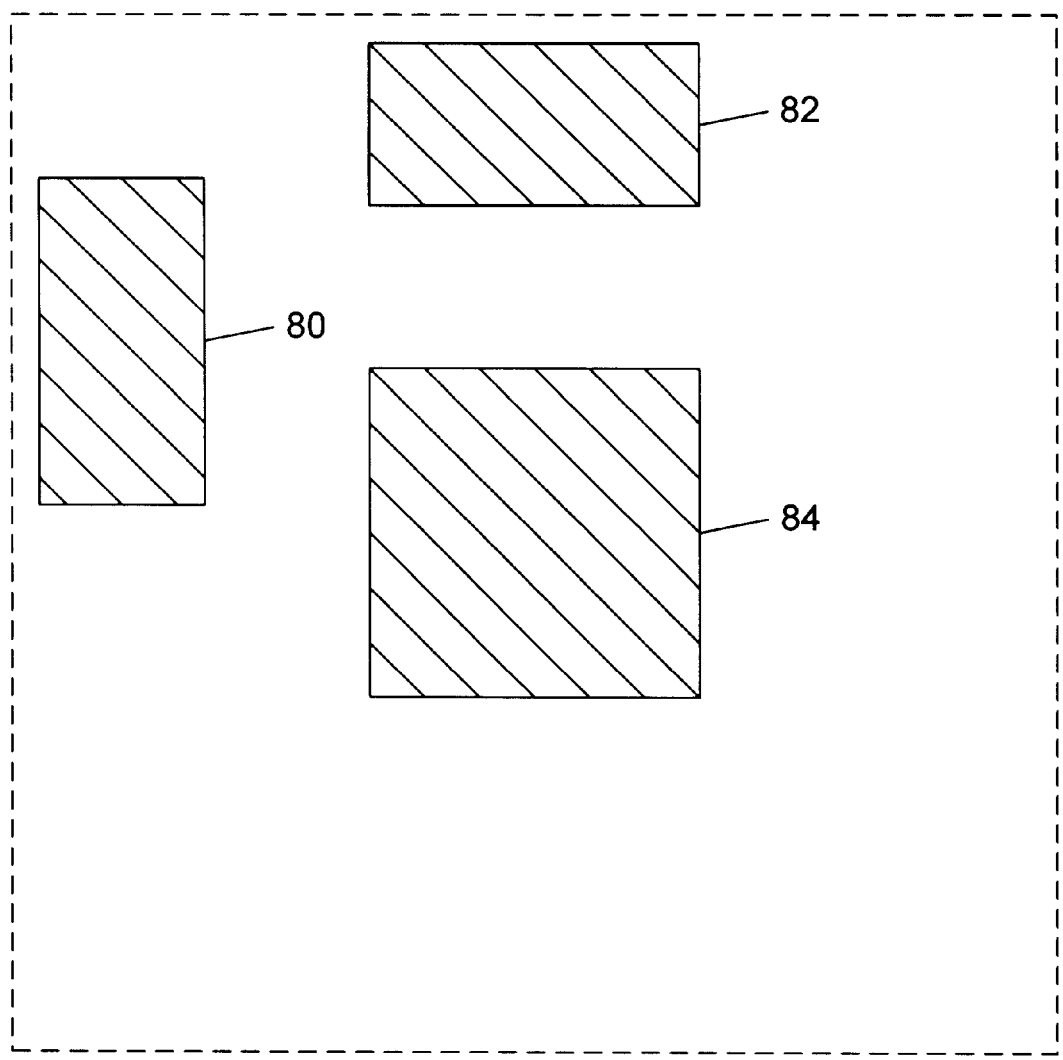
FIG. 7 is a top plan view of three features to be formed upon an exposed surface of a semiconductor wafer.
Figure 8:
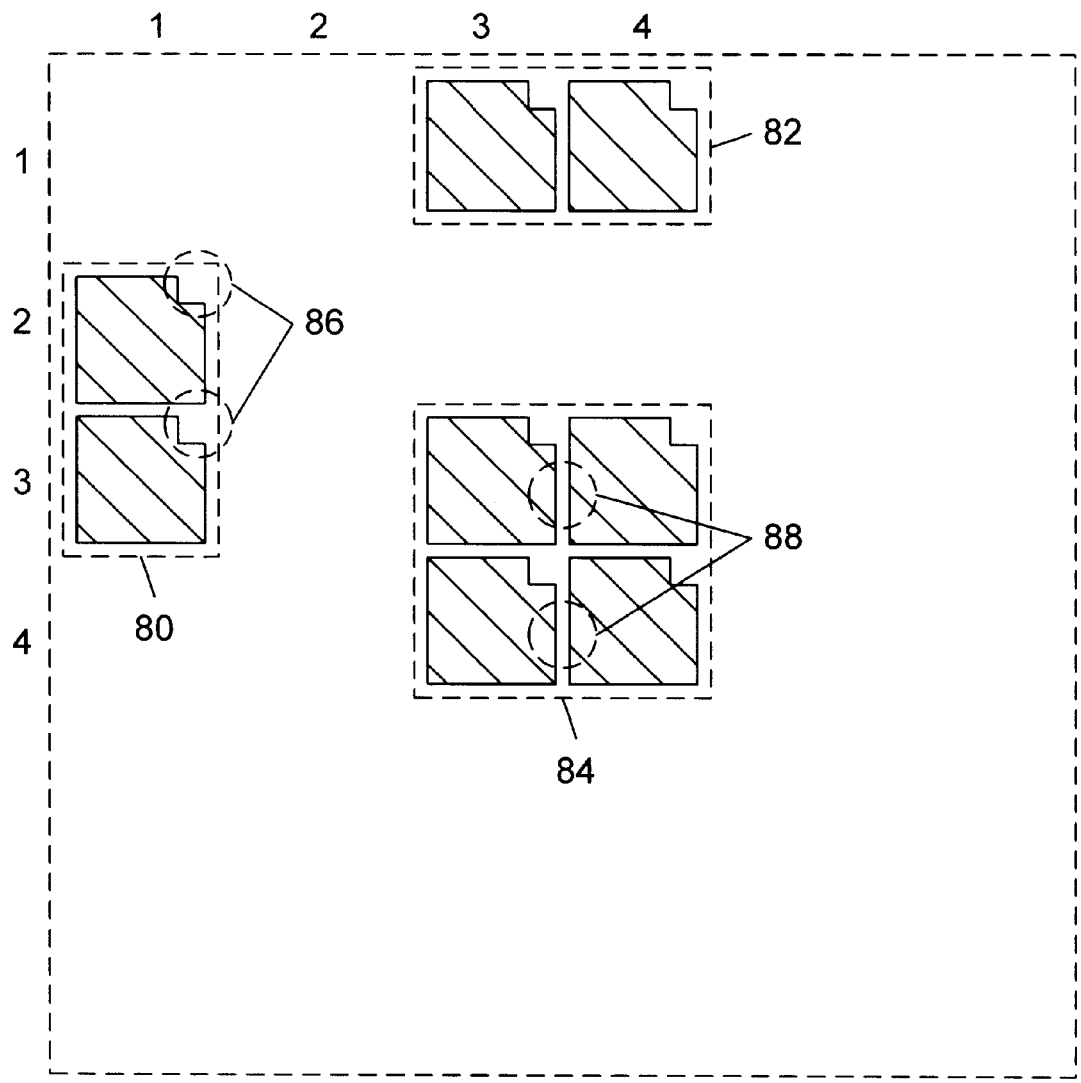
FIG. 8 is a top plan view of an attempt to form the features of FIG. 7 using the active matrix embodiment of the LCD panel shown in FIGS. 6a–b and a single exposure, wherein the features have voids caused by the opaque structure of FIG. 6b.

FIGS. 7–10 will now be used to illustrate an exposure method employing multiple overlapping exposures in order to reduce the problem presented by opaque structures between pixels. FIG. 7 is a top plan view of three features 80, 82, and 84 to be formed upon an exposed surface of a semiconductor wafer. LCD panel 14 employs the active matrix embodiment shown in FIGS. 6a–b. Features 80 and 82 correspond to two adjacent pixels of LCD panel 14, and feature 84 corresponds to four adjacent pixels of LCD panel 14. A layer of a desired material is first formed over the surface of the semiconductor wafer. A layer of a negative light-sensitive photoresist material is then deposited over the layer of the desired material. LCD panel 14 is positioned between a light source and the negative photoresist layer. A reversed image of FIG. 7 is displayed upon LCD panel 14 during exposure of the negative photoresist material. Electrical signals are generated and coupled to LCD panel 14 such that the pixels of LCD panel 14 corresponding to features 80, 82, and 84 are substantially clear, and the remaining pixels of LCD panel 14 are substantially opaque. The negative photoresist layer is exposed to light produced by the light source and passing through LCD panel 14 for a predetermined exposure period. The negative photoresist material becomes soluble where not exposed to light. FIG. 8 is a top plan view of features 80, 82, and 84 produced using the active matrix embodiment of LCD panel 14 shown in FIG. 6. Voids 86 are caused by opaque portions 79 of opaque structure 78 used to shield the electrical switching elements from light. Voids 88 are caused by the remainder of opaque structure 78 used to prevent light from passing through LCD panel 14 between pixels 40.

Figure 9:
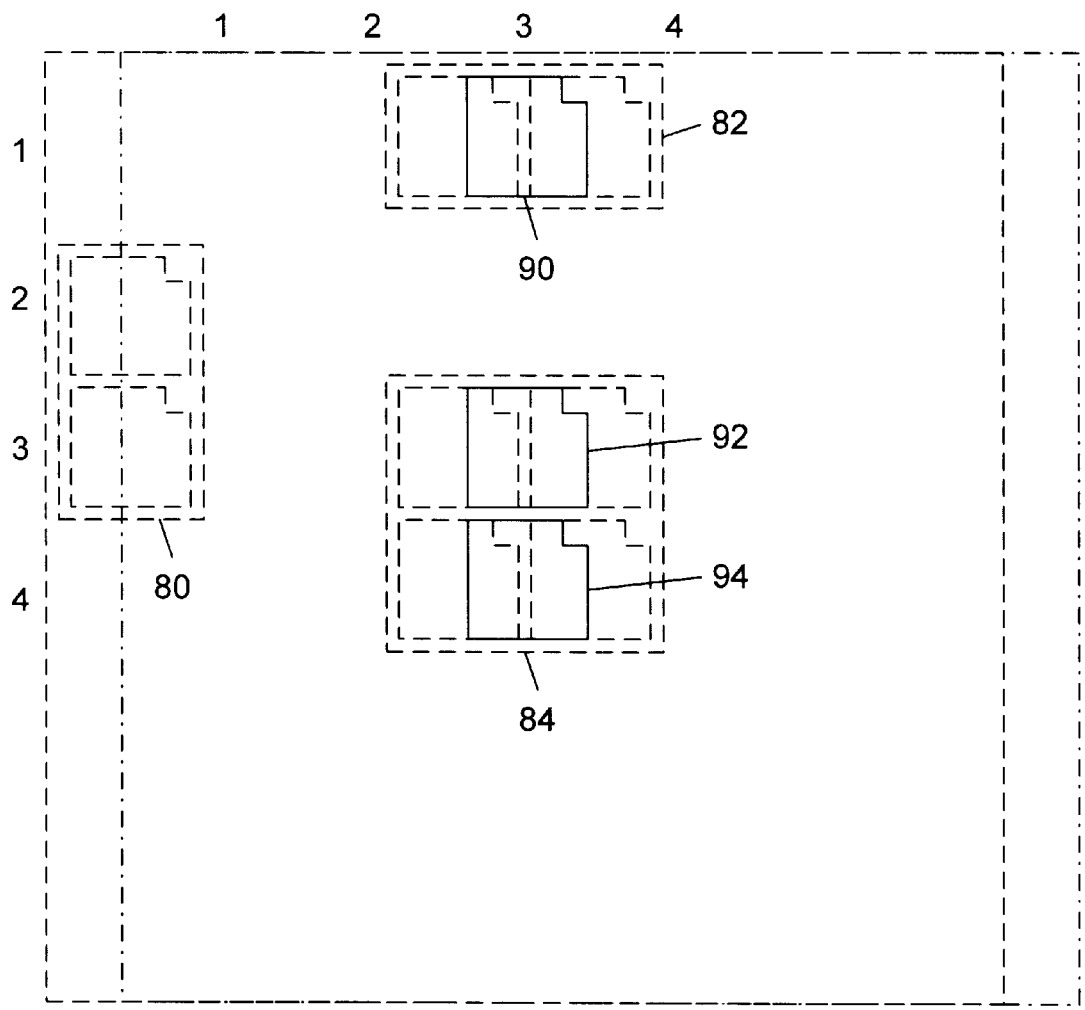
FIG. 9 is a top plan view illustrating a first multiple exposure process which reduces the deleterious effects of the opaque structure of FIG. 6b, wherein the semiconductor wafer is moved a distance equal to half a pixel to the right during a time period between a first exposure and a second reinforcing exposure.

FIG. 9 is a top plan view illustrating a first multiple exposure process which reduces the deleterious effects of opaque structure 78 in FIG. 6b. After a first exposure is performed as described above, the electrical signals are altered in order to cause each pixel of LCD panel 14 to substantially block light produced by the light source. While the light is blocked, the semiconductor wafer is moved a distance equal to half a pixel to the right. The electrical signals are then altered such that all pixels of LCD panel 14 are opaque except those corresponding to areas 90, 92, and 94. The negative photoresist layer is again exposed to light passing through the LCD panel for the predetermined exposure period. It is noted that the second pattern is designed to reinforce the first pattern and to expose portions left unexposed during the first exposure due to the presence of the opaque structures between pixels. As a result, a number of the voids in produced features 82 and 84 are eliminated.

Figure 10:
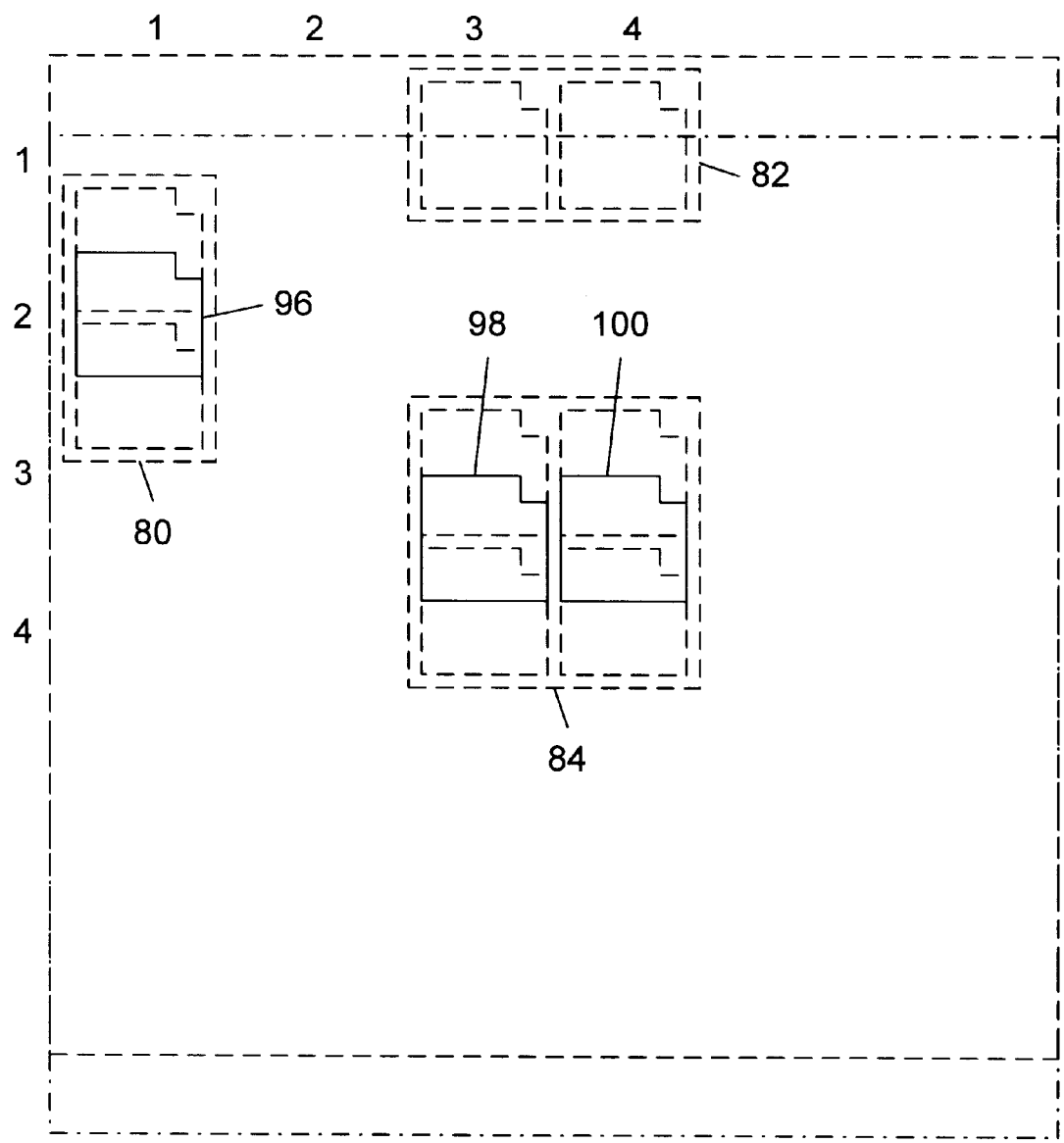
FIG. 10 is a top plan view illustrating a second multiple exposure process which reduces the deleterious effects of the opaque structure of FIG. 6b, wherein the semiconductor wafer is moved a distance equal to half a pixel in a downward direction during the time period between the first exposure and a second reinforcing exposure.

FIG. 10 is a top plan view illustrating a second multiple exposure process which reduces the deleterious effects of opaque structure 78 in FIG. 6b. After a first exposure as in FIG. 8, the electrical signals are altered in order to cause each pixel of LCD panel 14 to substantially block light produced by the light source. While the light is blocked, the semiconductor wafer is moved a distance equal to half a pixel in a downward direction. The electrical signals are then altered such that all pixels of LCD panel 14 are opaque except those corresponding to areas 96, 98, and 100. The negative photoresist layer is again exposed to light passing through the LCD panel for the predetermined exposure period. Again, the second pattern is designed to reinforce the first pattern and to expose portions left unexposed during the first exposure due to the presence of the opaque structures between pixels. Some of the voids in produced features 80 and 84 are eliminated as a result.

It is noted that the sets of voids eliminated in the first and second multiple exposure processes described above do not have any elements in common (i.e., do not overlap). A majority of the voids in produced features 80, 82, and 84 may be eliminated by performing a three-exposure process combining the multiple exposures illustrated in FIGS. 9 and 10. In addition, the semiconductor wafer may be oriented in yet other directions between multiple exposures in order to further reduce the number of voids in produced features.

It will be appreciated by those skilled in the art having the benefit of this disclosure that this invention is believed to be a system and method for selectively exposing a portion of a layer of a light-sensitive material to light employing an LCD panel as a configurable mask. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An exposure system for selectively exposing a portion of a layer of a light-sensitive material to light, comprising:
   a light source configured to produce light;
   an LCD panel positioned between the light source and the light-sensitive layer, wherein the LCD panel is configured to selectively pass and block light emitted by the light source thereby displaying a pattern;

a fan configured to blow air across the LCD panel in order to cool the LCD panel; and reducing means positioned between the LCD panel and the light-sensitive layer for forming a reduced image of the pattern displayed by the LCD panel upon the layer of the light-sensitive material, wherein the reduced image has dimensions smaller than corresponding dimensions of the pattern displayed by the LCD panel.

2. The exposure system as recited in claim 1, wherein a pattern is displayed by the LCD panel which comprises a clear portion and an opaque portion, and wherein the clear portion substantially passes light produced by the light source, and wherein the opaque portion substantially blocks light produced by the light source.

3. The exposure system as recited in claim 2, wherein the LCD panel comprises a plurality of pixel elements, and wherein each of the pixel elements either substantially passes light produced by the light source or substantially blocks light produced by the light source in response to at least one of a plurality of electrical signals.

4. The exposure system as recited in claim 3, wherein the plurality of pixel elements are arranged in a two-dimensional matrix, and wherein an opaque structure exists between the pixel elements in order to prevent light from passing through the LCD panel between the pixel elements.

5. The exposure system as recited in claim 4, wherein the clear portion of the LCD panel comprises a subset of the plurality of the pixel elements, and wherein the opaque portion comprises the remaining pixel elements.

6. The exposure system as recited in claim 4, wherein an LCD system comprises the LCD panel, and wherein the LCD system further comprises:

a display driver coupled to the LCD panel and configured to produce the plurality of electrical signals;

a memory unit configured to store data; and a control unit coupled between the display driver and the memory unit, wherein the control unit is configured to retrieve data from the memory unit and to provide the data to the display driver.

7. The exposure system as recited in claim 6, wherein the control unit is adapted for coupling to a computer system, and wherein the control unit is further configured to receive data from the computer system and to store the data within the memory unit.

8. The exposure system as recited in claim 7, wherein the memory unit comprises at least one volatile semiconductor memory device.

9. The exposure system as recited in claim 7, wherein the memory unit comprises at least one non-volatile semiconductor memory device.

10. A step-and-repeat projection exposure system for selectively exposing a portion of a layer of a light-sensitive material to light, wherein the light-sensitive layer is formed upon a surface of a semiconductor wafer, the step-and-repeat projection exposure system comprising:

a light source configured to produce light at a plurality of wavelengths;

an LCD panel positioned between the light source and the light-sensitive layer and configured to display a pattern;

a mirror positioned on a side of light source opposite that of the LCD panel and configured to reflect light back to the light source;

a filter positioned between the light source and the LCD panel and configured to pass light produced by the light source and having wavelengths within a desired range;

a condenser lens positioned between the filter and the LCD panel and configured to focus light which passes through the filter;

a reduction lens positioned between the LCD panel and the light-sensitive layer, wherein the reduction lens is configured to focus light which passes through the LCD panel in order to form an image of the pattern displayed by the LCD panel upon the layer of the light-sensitive material;

a fan configured to blow air across the filter and the LCD panel;

an x-y stage, wherein the semiconductor wafer is positioned upon the x-y stage, and wherein the x-y stage is configured to move the semiconductor wafer laterally in relation to the light focused by the reduction lens; and a base, wherein the x-y stage is positioned upon the base, and wherein the mirror, the light source, the filter, the condenser lens, the LCD panel, the fan, and the reduction lens are held in a fixed position relative to the base.

11. The step-and-repeat projection exposure system as recited in claim 10, wherein the light source produces light in the ultra-violet wavelength range extending from about 350 nm to approximately 450 nm.

12. The step-and-repeat projection exposure system as recited in claim 11, wherein the light source is a mercury-vapor lamp.

13. The step-and-repeat projection exposure system as recited in claim 10, wherein the pattern displayed by the LCD panel comprises a clear portion and an opaque portion, and wherein the clear portion substantially passes light produced by the light source, and wherein the opaque portion substantially blocks light produced by the light source.

14. The step-and-repeat projection exposure system as recited in claim 13, wherein the LCD panel comprises a plurality of pixel elements, and wherein each of the pixel elements either substantially passes light produced by the light source or substantially blocks light produced by the light source in response to at least one of a plurality of electrical signals.

15. The exposure system as recited in claim 14, wherein the plurality of pixel elements are arranged in a two-dimensional matrix, and wherein an opaque structure exists between the pixel elements in order to prevent light from passing through the LCD panel between the pixel elements.

16. The step-and-repeat projection exposure system as recited in claim 15, wherein the clear portion of the LCD panel comprises a subset of the plurality of the pixel elements, and wherein the opaque portion comprises the remaining pixel elements.

17. The step-and-repeat projection exposure system as recited in claim 15, wherein an LCD system comprises the LCD panel, and wherein the LCD system further comprises:

a display driver coupled to the LCD panel and configured to produce the plurality of electrical signals;

a memory unit configured to store data; and a control unit coupled between the display driver and the memory unit, wherein the control unit is configured to retrieve data from the memory unit and to provide the data to the display driver.

18. The step-and-repeat projection exposure system as recited in claim 17, wherein the control unit is adapted for coupling to a computer system, and wherein the control unit is further configured to receive data from the computer system and to store the data within the memory unit.

19. The step-and-repeat projection exposure system as recited in claim 18, wherein the memory unit comprises at least one volatile semiconductor memory device.

20. The step-and-repeat projection exposure system as recited in claim 18, wherein the memory unit comprises at least one non-volatile semiconductor memory device.

21. The step-and-repeat projection exposure system as recited in claim 10, wherein the dimensions of the image focused upon the light-sensitive layer are smaller than the dimensions of the pattern displayed by the LCD panel.

22. A projection exposure system for selectively exposing a portion of a layer of a light-sensitive material to light, wherein the light-sensitive layer is formed upon a surface of a semiconductor wafer, the projection exposure system comprising:

a light source configured to produce light at a plurality of wavelengths;

an LCD panel positioned between the light source and the light-sensitive layer and configured to display a pattern;

a fan configured to blow air across the LCD panel in order to cool the LCD panel; and a reduction lens positioned between the LCD panel and the light-sensitive layers wherein the reduction lens is configured to form a reduced image of the pattern displayed by the LCD panel upon the layer of the light-sensitive material, wherein the reduced image has dimensions smaller than corresponding dimensions of the pattern displayed by the LCD panel.

23. The projection exposure system of claim 22, further comprising a mirror positioned on a side of light source opposite that of the LCD panel and configured to reflect light back to the light source.

24. The projection exposure system of claim 22, further comprising a filter positioned between the light source and the LCD panel and configured to pass light produced by the light source and having wavelengths within a desired range.

25. The projection exposure system of claim 24, further comprising a condenser lens positioned between the filter and the LCD panel and configured to focus light which passes through the filter.

26. The projection exposure system of claim 24, wherein the fan is further configured to blow air across the filter in order to cool the filter.

27. The projection exposure system of claim 22, further comprising means for moving the semiconductor wafer and the reduced image formed by the reduction lens laterally in relation to one another.

* * * * *